(12) United States Patent
Kai

(10) Patent No.: US 10,049,715 B2
(45) Date of Patent: Aug. 14, 2018

(54) SEMICONDUCTOR STORAGE DEVICE AND METHOD FOR WRITING OF THE SAME

(71) Applicant: DENSO CORPORATION, Kariya, Aichi-pref. (JP)

(72) Inventor: Yoshihide Kai, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/568,811

(22) PCT Filed: Aug. 1, 2016

(86) PCT No.: PCT/JP2016/072463
§ 371 (c)(1),
(2) Date: Oct. 24, 2017

(87) PCT Pub. No.: WO2017/022700
PCT Pub. Date: Feb. 9, 2017

(65) Prior Publication Data
US 2018/0108395 A1 Apr. 19, 2018

(30) Foreign Application Priority Data
Aug. 5, 2015 (JP) .................... 2015-155081

(51) Int. Cl.
*G11C 11/34* (2006.01)
*G11C 11/404* (2006.01)
(Continued)

(52) U.S. Cl.
CPC .......... *G11C 11/404* (2013.01); *G11C 7/1096* (2013.01); *G11C 11/4074* (2013.01); *G11C 16/28* (2013.01)

(58) Field of Classification Search
CPC . G11C 11/404; G11C 11/0407; G11C 7/1096; G11C 16/28; G11C 16/4075
(Continued)

(56) References Cited

U.S. PATENT DOCUMENTS 7,825,877 B2 * 11/2010 Yoshida ................... G09G 3/22
345/75.2
7,983,081 B2    7/2011 Fang et al.
(Continued)

FOREIGN PATENT DOCUMENTS

| JP | H11-297084 A | 10/1999 |
|----|--------------|---------|
| JP | 2000-123584 A | 4/2000 |
| JP | 2004-055004 A | 2/2004 |

OTHER PUBLICATIONS

Frank Ruei-Ling Lin & Charles Ching-Hsiang Hsu, "P-Channel Flash Memory Technology"Chapter 8 in "Nonvolatile Memory Technologies with Emphasis on Flash: A Comprehensive Guide to Understanding and Using NVM Devices", Joe E. Brewer and Manzur Gill, IWWW Press Series on Microelectronic Systems, Wiley-Interscience, A John Wiley & Sons, Inc., Publication. 2008. (discussed on p. 1 of the specification).

*Primary Examiner* — Gene Auduong
(74) *Attorney, Agent, or Firm* — Posz Law Group, PLC

(57) ABSTRACT

A semiconductor storage device includes a memory cell, a switch, a source driver, a drain driver, a voltage measurement circuit and a control electrode driver. The memory cell has a control electrode, a floating electrode, a source and a drain. In a writing to the memory cell, the voltage measurement circuit measures a voltage generated between the control electrode and the source when the switch is in an on state connecting the control electrode and the drain and a predetermined current flows from the current source to the memory cell, and the control electrode driver applies to the control electrode a voltage that is controlled based on the voltage measured by the voltage measurement circuit.

10 Claims, 9 Drawing Sheets

(51) Int. Cl.
*G11C 11/4074* (2006.01)
*G11C 7/10* (2006.01)
*G11C 16/28* (2006.01)

(58) Field of Classification Search
USPC ...... 365/186, 185.2, 185.18, 185.21, 189.09, 365/196
See application file for complete search history.

(56) References Cited

U.S. PATENT DOCUMENTS

| | | | |
|---|---|---|---|
| 2007/0080905 A1* | 4/2007 | Takahara | G09G 3/3233 345/76 |
| 2009/0171432 A1* | 7/2009 | Von Segesser | A61F 2/2418 623/1.11 |
| 2009/0268516 A1* | 10/2009 | Murin | G11C 11/5628 365/185.03 |

\* cited by examiner

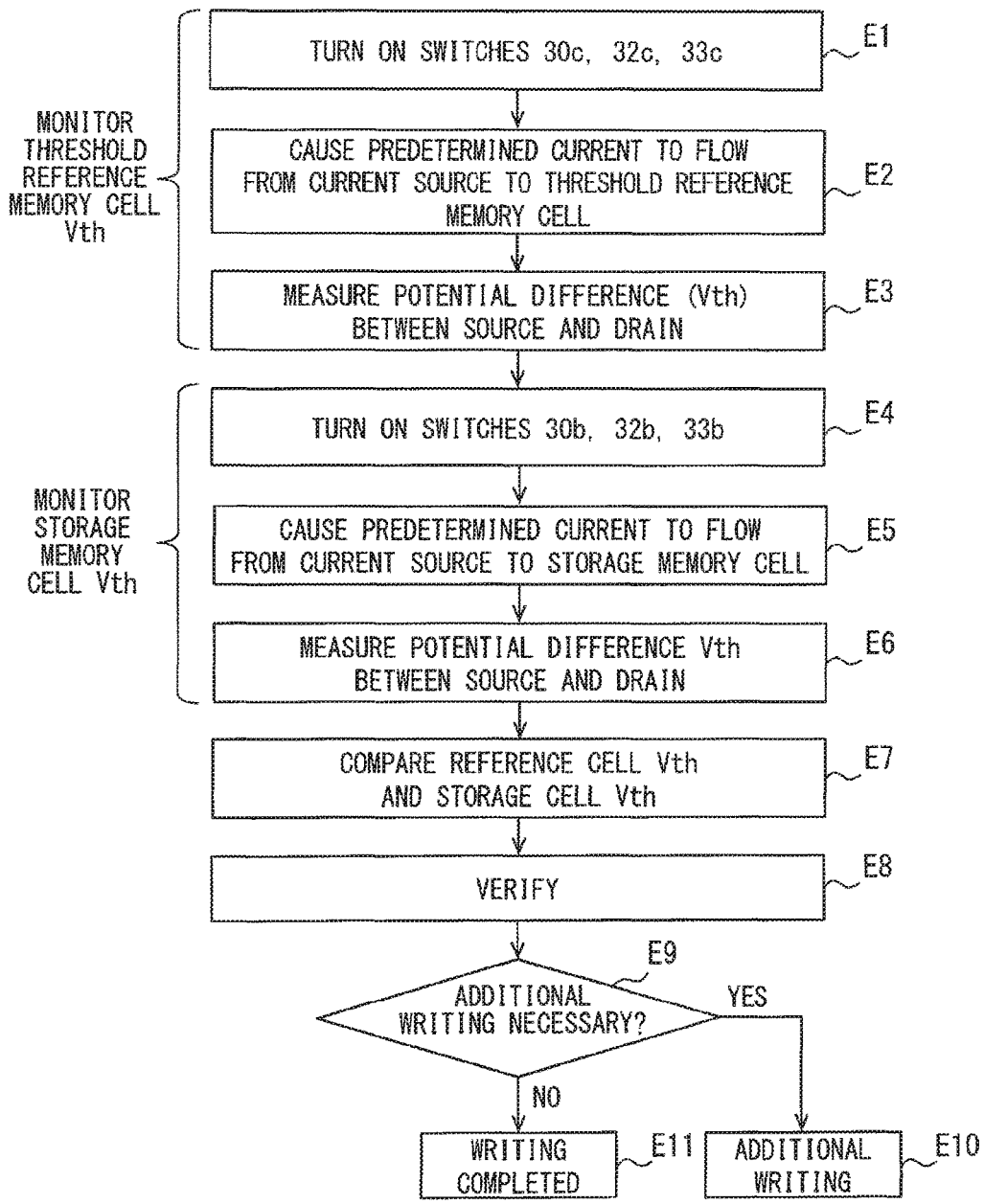

SEMICONDUCTOR STORAGE DEVICE AND METHOD FOR WRITING OF THE SAME

CROSS REFERENCE TO RELATED APPLICATIONS

This application is a U.S. national stage of International Patent Application No. PCT/JP2016/072463 filed on Aug. 1, 2016 and is based on Japanese Patent Application No. 2015-155081 filed on Aug. 5, 2015, the disclosures of which are incorporated herein by reference.

TECHNICAL FIELD

The present disclosure relates to a semiconductor storage device and a method for writing of the same.

BACKGROUND ART

For example, in a conventional writing to a p-channel flash memory cell, an application voltage to the memory cell had a fixed value.

PRIOR ART LITERATURE

Patent Literature

Patent Literature 1 JP2004-55004A

Non-Patent Literature

Non-patent Literature 1: Joe Brewer, Manzur Gill, "Nonvolatile Memory Technologies with Emphasis on Flash: A Comprehensive Guide to Understanding and Using Flash Memory Devices", Wiley-IEEE Press

SUMMARY OF INVENTION

Suitable writing conditions are likely to be different between respective memory cells depending on variations in processing, the temperature, and states of writing. Thus, if the writing is executed under the same condition to all of the memory cells, it is not necessarily true that the writing is efficiently conducted to all of the memory cells. In such a case, since the state of writing is not uniform, there is a possibility that variations in thresholds of the memory cells to which data have been written will arise.

It is an object of the present disclosure to provide a semiconductor storage device and a method for writing of the semiconductor storage device, which are capable of improving the efficiency of writing, and the uniformity of the writing.

According to an aspect of the present disclosure, a semiconductor storage device includes a memory cell having a control electrode, a floating electrode, a source and a drain. The semiconductor storage device further includes a switch that connects the control electrode and the drain, a source driver that is connected to the source and applies a predetermined voltage to the source, a current source that is configured to be connected to the source and to supply a predetermined current to the source, and a drain driver that is connected to the drain and applies a predetermined voltage to the drain. The semiconductor storage device still includes a voltage measurement circuit that measures a voltage occurring between the control electrode and the source, and a control electrode driver that applies a predetermined voltage to the control electrode. In writing to the memory cell, the voltage measurement circuit measures a voltage occurring between the control electrode and the source when the predetermined current flows from the current source to the memory cell in a state where the switch is turned on. The control electrode driver applies a voltage controlled based on the voltage measures to the control electrode.

According to a second aspect of the present disclosure, a method for writing of the semiconductor storage device according to the first aspect described above includes: in writing the memory cell, turning on the switch, and subsequently conducting the predetermined current from the current source to the memory cell; measuring the voltage occurring between the control electrode and the source by the voltage measurement circuit when the predetermined current flows between the source and the drain by the voltage measurement circuit, and subsequently applying a voltage controlled based on the voltage measured to the control electrode by the control electrode driver.

According to a third aspect of the present disclosure, a method for writing of the semiconductor storage device according to the first aspect described above includes: in writing the memory cell, turning on the switch and causing the predetermined current to flow from the current source to the memory cell; measuring a first voltage generated between the control electrode and the source by the voltage measurement circuit when the predetermined current flows between the source and the drain; executing a first writing by applying a voltage that is controlled based on the first voltage to the control electrode from the control electrode driver: turning on the switch and causing the predetermined current to flow from the current source to the memory cell; measuring a second voltage generated between the control electrode and the source by the voltage measurement circuit when the predetermined current flows between the source and the drain; and executing a second writing by applying a voltage that is controlled based on the second voltage to the control electrode from the control electrode driver.

According to a fourth aspect of the present disclosure, a method for writing of the semiconductor storage device according to the first aspect described above includes: in writing the memory cell, turning on the switch and causing the predetermined current to flow from the current source to the memory cell; measuring a voltage generated between the control electrode and the source by the voltage measurement circuit when the predetermined current flows between the source and the drain; and executing a writing by applying a voltage that is controlled based on the voltage measured to the control electrode from the control electrode driver. The turning on the switch, the causing the predetermined current to flow, the measuring the voltage, and the executing the writing are repeated until the voltage reaches a predetermined value.

According to a fifth aspect of the present disclosure, a semiconductor storage device including: a reference memory cell that at least includes a first control electrode, a first floating electrode, a first source, and a first drain; a storage memory cell that at least includes a second control electrode, a second floating electrode, a second source, and a second drain; a first source driver that is connected to the first source and is configured to apply a predetermined voltage to the first source; a current source that is configured to be connected to the first source and the second source and to supply a predetermined current to the first source or the second source; a first drain driver that is connected to the first drain and is configured to apply a predetermined voltage to the first drain; a switch that is configured to connect the first control electrode and the first drain; a voltage measurement circuit that is configured to measure a voltage generated between the first control electrode and the first source; a first control electrode driver that is configured to apply a predetermined voltage to the first control electrode; a second source driver that is connected to the second source and is configured to apply a predetermined voltage to the second source; a second drain driver that is connected to the second drain and is configured to apply a predetermined voltage to the second drain; and a second control electrode driver that is configured to apply a predetermined voltage to the second control electrode. The voltage measurement circuit measures a voltage generated between the first control electrode and the first source when the switch is in an on state and the predetermined current flows from the current source to the memory cell. The second source driver, the second drain driver, the second control electrode driver generate voltages that are controlled based on the voltage that is generated between the first control electrode and the first source electrode and is measured by the voltage measurement circuit.

According to a sixth aspect of the present disclosure, a method for writing of the semiconductor storage device according to the fifth aspect includes: measuring a voltage generated between the first control electrode and the first source when the switch is in an on state and the predetermined current flow from the current source to the reference memory cell; and controlling voltages to be generated from the second source driver, the second drain driver and the second control electrode driver based on the voltage that is generated between the first control electrode and the first source and is measured by the voltage measurement circuit.

According to the structures and methods described hereinabove, the writing can be executed to the memory cell of the semiconductor storage device using the optimum condition, resulting in improvement of the writing efficiency and improvement of the uniformity of the writing.

BRIEF DESCRIPTION OF DRAWINGS

The above and other objects, features and advantages of the present disclosure will become more apparent from the following detailed description made with reference to the accompanying drawings, in which:

FIG. 10 is a flowchart illustrating an outline of a writing processing of the semiconductor storage device according to the fifth embodiment.

DESCRIPTION OF EMBODIMENTS

Hereinafter, embodiments in which the present disclosure is implemented will be described with reference to the drawings. In the embodiments, the same elements will be designated with the same reference numbers, and a description thereof will be omitted.

First Embodiment

Figure 1:
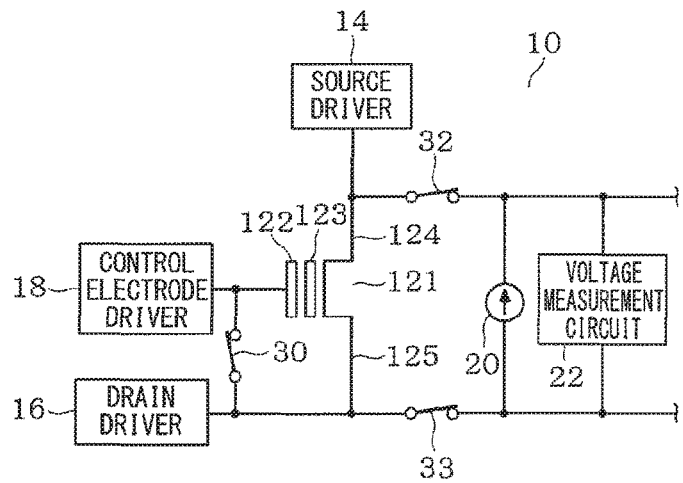
FIG. 1 is a block diagram illustrating a schematic structure of a semiconductor storage device according to a first embodiment.

As shown in FIG. 1, a semiconductor storage device 10 according to the present embodiment is, for example, a p-channel flash memory, and has a memory cell 121. The memory cell 121 has a control electrode 122, a floating electrode 123, a source 124 and a drain 125. Writing to the memory cell 121 is implemented as electrons are injected to the floating electrode 123.

The semiconductor storage device 10 includes a source driver 14 and a drain driver 16. The source driver 14 is connected to the source 124, and applies a predetermined voltage to the source 124. The drain driver 16 is connected to the drain 125, and applies a predetermined voltage to the drain 125. The semiconductor storage device 10 includes a control electrode driver 18. The control electrode driver 18 is connected to the control electrode 122, and applies a predetermined voltage to the control electrode 122.

A switch 30 is provided between the control electrode 122 and the drain 125, and is configured to switch on and off the connection between the control electrode 122 and the drain 125. The semiconductor storage device 10 includes a current source 20 connecting the source 124 and the drain 125, and a voltage measurement circuit 22 that is configured to measure a voltage between the source 124 and the drain 125. A switch 32 is provided between the source 124 and the current source 20 and voltage measurement circuit 22, and is configured to switch on and off the connection between the source 124 and the current source 20 and voltage measurement circuit 22. A switch 33 is provided between the drain 125 and the current source 20 and voltage measurement circuit 22, and is configured to switch on and off the connection between the drain 125 and the current source 20 and voltage measurement circuit 22.

The voltage measurement circuit 22 can measure a voltage between the control electrode 122 and the source 124 when the switches 30, 32, 33 are in on states (i.e., connected).

Figure 2:
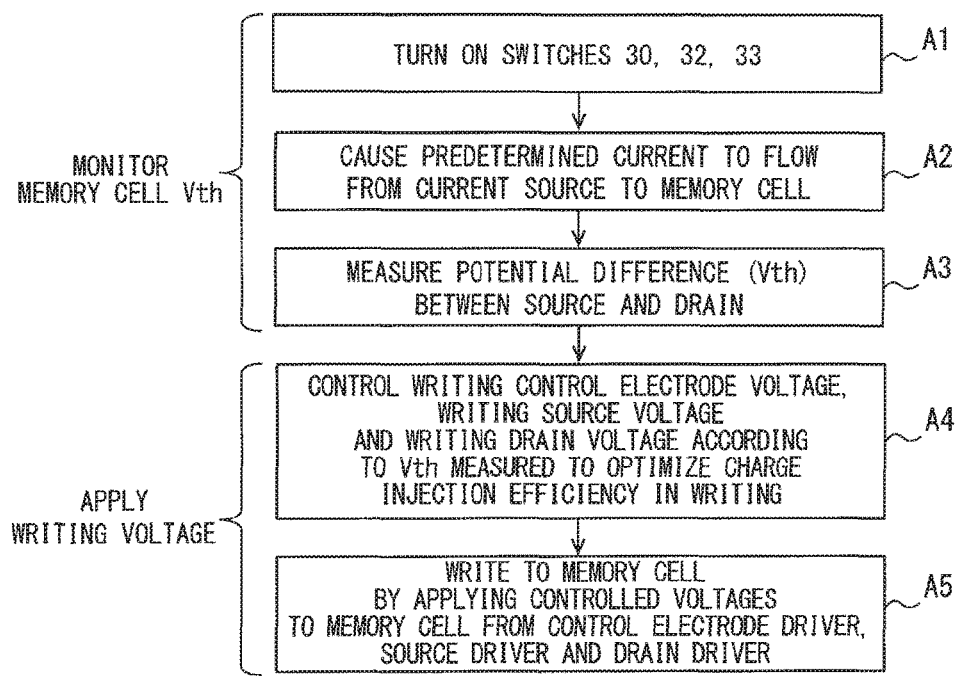
FIG. 2 is a flowchart illustrating an outline of a writing processing of the semiconductor storage device according to the first embodiment.

As a procedure of a writing processing of the semiconductor storage device 10 of the present embodiment, as shown in FIG. 2, firstly, the switches 30, 32 and 33 are turned on (A1). Next, the control electrode driver 18 applies a voltage to the control electrode 122 until a predetermined current flows to the memory cell 121 from the current source 20 (A2). That is, a voltage is applied between the control electrode 122 and the source 124. In this case, the value of the predetermined current is very small, and is for example defined as 1 μA. These steps are for measuring a threshold of the memory cell 121. Next, a potential difference (i.e., voltage, voltage difference) between the source 124 and the drain 125 is measured by the voltage measurement circuit 22 (A3). Since the control electrode 122 and the drain 125 are in a connected state, the potential difference (voltage) is a threshold voltage (Vth) of the memory cell 121.

Next, based on the potential difference measured, that is, based on the threshold voltage of the memory cell 121, a writing control electrode voltage to be applied to the control electrode 122, a writing source voltage to be applied to the source 124, a writing drain voltage to be applied to the drain 125 are controlled (A4). The writing control electrode voltage to be applied to the control electrode 122 is controlled by the control electrode driver 18. The writing source voltage to be applied to the source 124 is controlled by the source driver 14. The writing drain voltage to be applied to the drain 125 is controlled by the drain driver 16.

These voltages are controlled based on the threshold voltage (Vth) of the memory cell 121 obtained in a step A3 so that an injection efficiency of electrons to the floating electrode 123 of the memory cell 121 is optimum. For example, in a case where the memory cell 121 is a p-channel memory cell, these voltages are controlled so that a difference between the voltage applied to the control electrode 122 and the voltage applied to the source 124 in the writing has a value approximate to the threshold voltage. In this case, the injection efficiency of electrons to the floating electrode 123 improves, and thus the writing efficiency improves.

Subsequently, the voltages controlled as described above are applied to the memory cell 121 respectively from the control electrode driver 18, the source driver 14 and the drain driver 16, to thereby execute the writing processing to the memory cell (A5).

The threshold voltage of the memory cell 121 is monitored by the steps A1 to A3 described above. Based on the threshold voltage monitored, the voltages applied to the control electrode 122, the source 124 and the drain 125 of the memory cell 121 are controlled by the steps A4 and A5, so the writing processing is executed under a condition where the injection efficiency of electrons to the floating electrode 123 is optimum.

As described above, according to the semiconductor storage device 10 and the method for writing of the semiconductor storage device 10 of the present embodiment, the threshold voltage of each of memory cells 121 of the semiconductor storage device 10 is measured, and the writing voltages to the respective memory cells 121 can be controlled based on the threshold voltages measured.

Accordingly, the injection efficiency of electrons to the floating electrode 123 improves, and the writing efficiency of the memory cell 121 improves. Therefore, the total writing time can be shortened in the semiconductor storage device 10 as a whole. Further, variations in writing can be reduced, and thus the writing can be uniformly executed.

Second Embodiment

Next, a second embodiment will be described. Hereinafter, only the differences from the first embodiment will be described. The structure of a semiconductor storage device 10 of the second embodiment is the same as the structure of the first embodiment.

Figure 3:
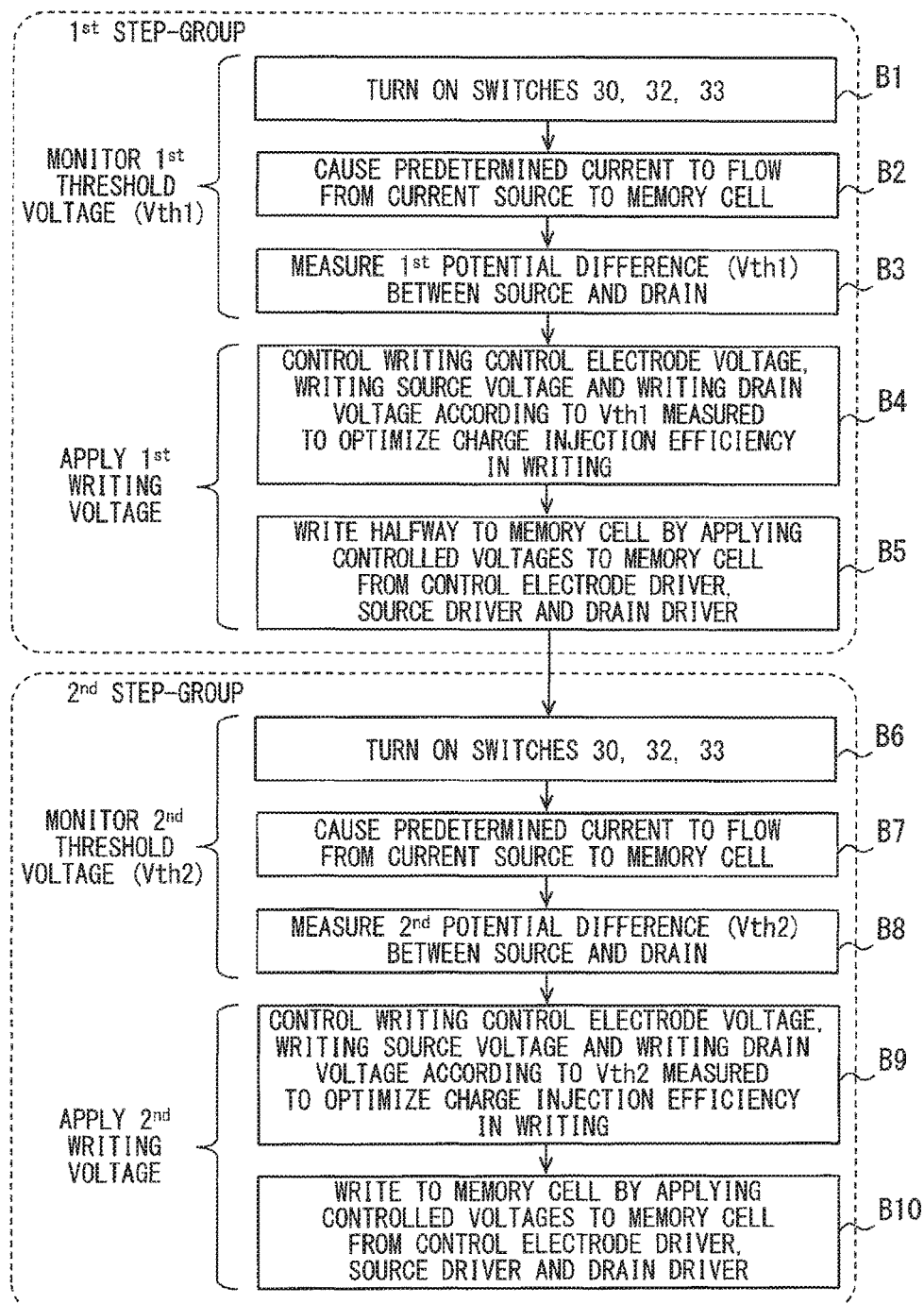
FIG. 3 is a flowchart illustrating an outline of a writing processing of a semiconductor storage device according to a second embodiment.

As shown in FIG. 3, in a writing processing of the second embodiment, firstly, the switches 30, 32 and 33 are turned on (B1). Next, a predetermined current is caused to flow to the memory cell 121 from the current source 20 (B2). That is, a voltage is applied between the control electrode 122 connected to the drain 125 and the source 124 so that the predetermined current flows in the memory cell 121. Next, a first potential difference (La, voltage, voltage difference) generated between the source 124 and the drain 125 is measured by the voltage measurement circuit 22 (B3). Since the control electrode 122 and the drain 125 are in the connected state, the first potential difference (voltage) is a threshold voltage of the memory cell 121 before writing. Hereinafter, the first potential difference will be referred to as a first threshold voltage (Vth1).

Next, based on the first potential difference, that is, based on the first threshold voltage of the memory cell 121, a writing control electrode voltage to be applied to the control electrode 122, a writing source voltage to be applied to the source 124, and a writing drain electrode voltage to be applied to the drain 125 are controlled (B4). These voltages are controlled based on the first threshold voltage (Vth1) obtained by the step B3 so that the injection efficiency of electrons to the floating electrode 123 of the memory cell 121 at the first threshold voltage is optimum.

Next, the switches 30, 32 and 33 are turned off, and then the voltages controlled are applied to the memory cell 121 respectively from the control electrode driver 18, the source driver 14 and the drain driver 16, to thereby execute the writing to the memory cell 121. In this case, the writing is not completed, but is conducted partway (B5). For example, assumed that the writing time in the first embodiment is 200 μs, and the writing time in this case is, for example, 100 μs.

The steps B1 to B5 described hereinabove are categorized into a first step-group, and the writing executed by the first step-group is referred to as a first writing.

Next, the switches 30, 32 and 33 are turned on (B6). Next, a predetermined current is caused to flow to the memory cell 121 from the current source 20 (B7). Subsequently, a second potential difference (i.e., voltage, voltage difference) between the source 124 and the drain 125 is measured by the voltage measurement circuit 22 (B8). Since the control electrode 122 and the drain 125 are in the connected state, the second potential difference (voltage) is a threshold voltage of the memory cell 121 in the state where the writing has been executed by the first writing. Hereinafter, the second potential difference will be referred to as a second threshold voltage (Vth2).

Next, based on the second potential difference measured, that is, based on the second threshold voltage of the memory cell 121, the writing control electrode voltage applied to the control electrode 122, the writing source voltage applied to the source 124, and the writing drain voltage applied to the drain 125 are controlled (B9). These voltages are controlled based on the second threshold voltage (Vth2) of the memory cell obtained by the step B8 so that the injection efficiency of the floating electrode 123 of the memory cell 121 at the second threshold voltage is optimum.

Next, after the switches 30, 32 and 33 are turned off, the voltages controlled above are applied to the memory cell 121 respectively from the control electrode driver 18, the source driver 14 and the drain driver 16, to thereby execute the writing to the memory cell 121 (310). Thereafter, this processing is repeated until the threshold voltage of the memory cell 121 reaches a target value.

The steps B6 to B10 described hereinabove are categorized into a second step-group, and the writing executed by the second step-group will be referred to as a second writing.

Figure 4:
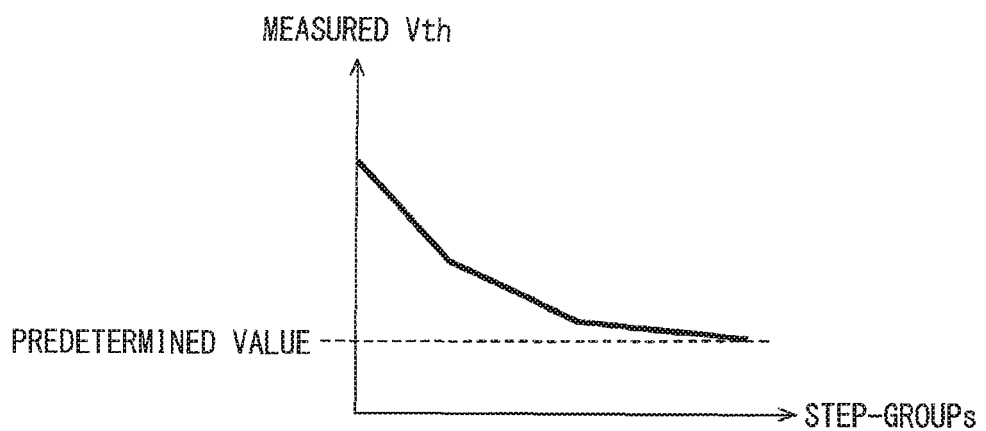
FIG. 4 is a graph illustrating a change in threshold of the semiconductor storage device according to the second embodiment.

FIG. 4 is a graph illustrating the threshold voltage that varies in accordance with the progression of the writing by the first writing of the first step-group and the second writing of the second step-group. It is appreciated that the threshold voltage converges to a predetermined value as the steps are repeated.

In the case where the memory cell 121 is a p-channel memory cell, as described hereinabove, the writing efficiency is optimum when the application voltage to the control electrode 122 is approximate to the threshold voltage. However, the threshold voltage varies constantly during the writing. The threshold voltage at the time of beginning the writing and the threshold voltage while after the writing has begun are different. Therefore, the writing voltage that has been applied as an optimum voltage at the time of beginning the writing is not optimum at a time while after the writing has begun.

In the second embodiment, the writing is executed to a halfway of a target threshold by the first writing processing, and the second threshold voltage during the writing is measured by the second step group. Based on the second threshold voltage measured, the writing voltage of the second writing processing is controlled. Therefore, the writing voltage can be kept at an optimum value from the beginning of the writing to the memory cell 121 to the end of the writing. Accordingly, the writing efficiency can be improved, and unevenness of the writing can be reduced, and the writing can be uniform.

Note that it has been described that the writing can be categorized into the first step group and the second step group. However, the writing is not limited to this example, and but may be categorized into further groups by adding a third step group (third writing) and a fourth step group (fourth writing).

Third Embodiment

Figure 5:
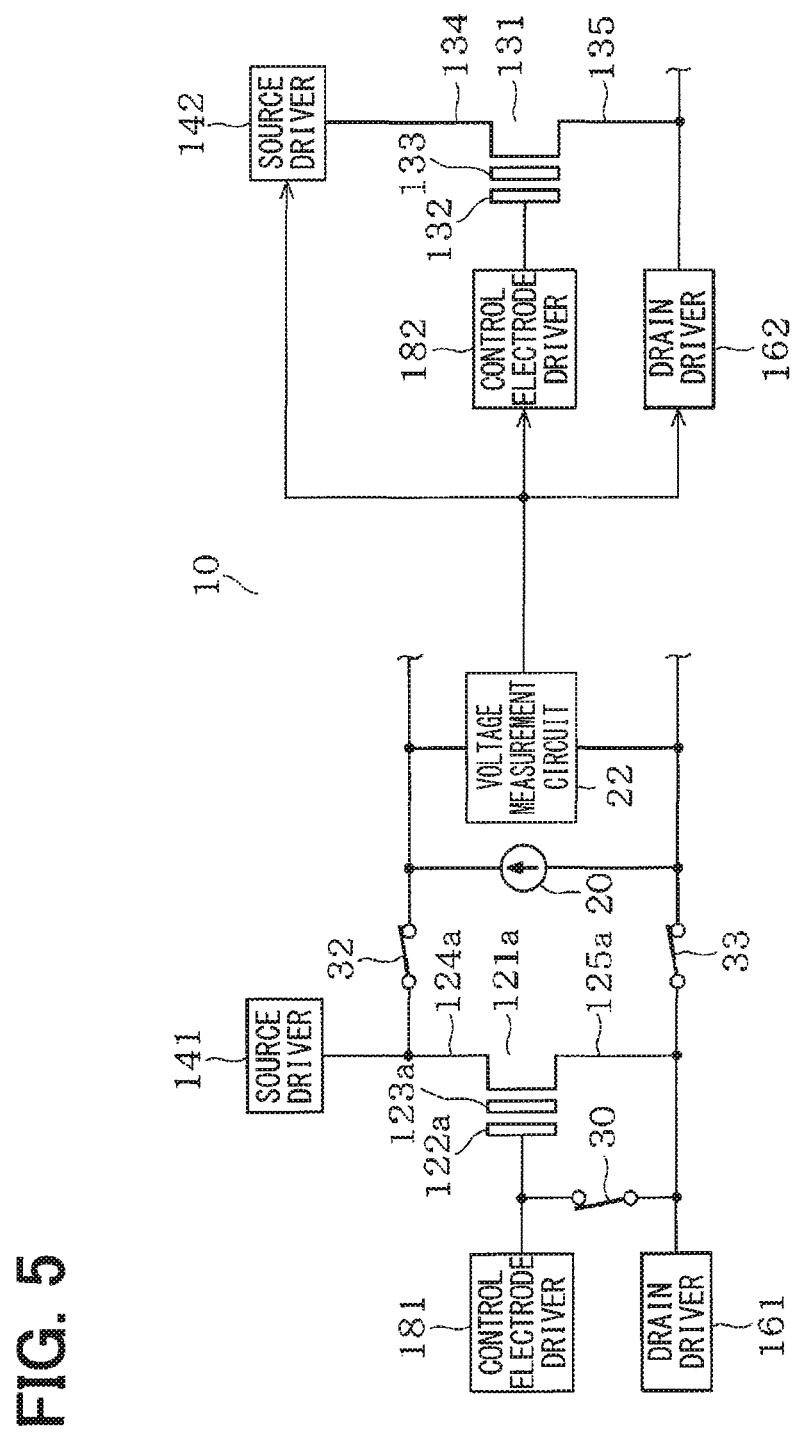
FIG. 5 is a block diagram illustrating an example of a structure of a semiconductor storage device according to a third embodiment.

Next, a third embodiment will be described. Hereinafter, only the differences from the first embodiment will be described. As shown in FIG. 5, the third embodiment is different from the first embodiment as having a reference memory cell 121a and a storage memory cell 131.

As shown in FIG. 5, a semiconductor storage device 10 has a reference memory cell 121a and a storage memory cell 131. The semiconductor storage device 10 includes a source driver 141 that is connected to a source 124a of the reference memory cell 121a, and applies a predetermined voltage to the source 124a. The semiconductor storage device 10 includes a drain driver 161 that is connected to a drain 125a, and applies a predetermined voltage to the drain 125a. Also, the semiconductor storage device 10 includes a control electrode driver 181 that is connected to a control electrode 122a, and applies a predetermined voltage to the control electrode 122a.

A switch 30 is provided between the control electrode 122a and the drain 125a, and is configured to switch on and off the connection between the control electrode 122a and the drain 125a. The semiconductor storage device 10 includes a current source 20 that connects the source 124a and the drain 125a, and a voltage measurement circuit 22 that is configured to measure a voltage between the source 124a and the drain 125a. A switch 32 is provided between the source 124a and the current source 20 and voltage measurement circuit 22. The switch 32 is configured to witch on and off the connection between the source 124a and the current source 20 and voltage measurement circuit 22.

When the switches 30, 32 and 33 are in the on states (i.e., connected), the voltage measurement circuit 22 measures the voltage between the source 124a and the drain 125a. The voltage measured is a threshold voltage of the reference memory cell 121a, as will be described hereinafter.

The semiconductor storage device 10 includes a source 134 of the storage memory cell 131, and a source driver 142 that applies a predetermined voltage to the source 134. The semiconductor storage device 10 also includes a drain driver 162 that is connected to a drain 135, and applies a predetermined voltage to the drain 135. The semiconductor storage device 10 further includes a control electrode driver 182 that is connected to a control electrode 132, and applies a predetermined voltage to the control electrode 132.

The threshold voltage of the reference memory cell 121a measured by the voltage measurement circuit 22 is transmitted to the source driver 142, the drain driver 162 and the control electrode driver 182. The source driver 142, the drain driver 162 and the control electrode driver 182 respectively control the voltages to be applied to the control electrode 132, the source 134 and the drain 135 based on the threshold voltage.

Figure 6:
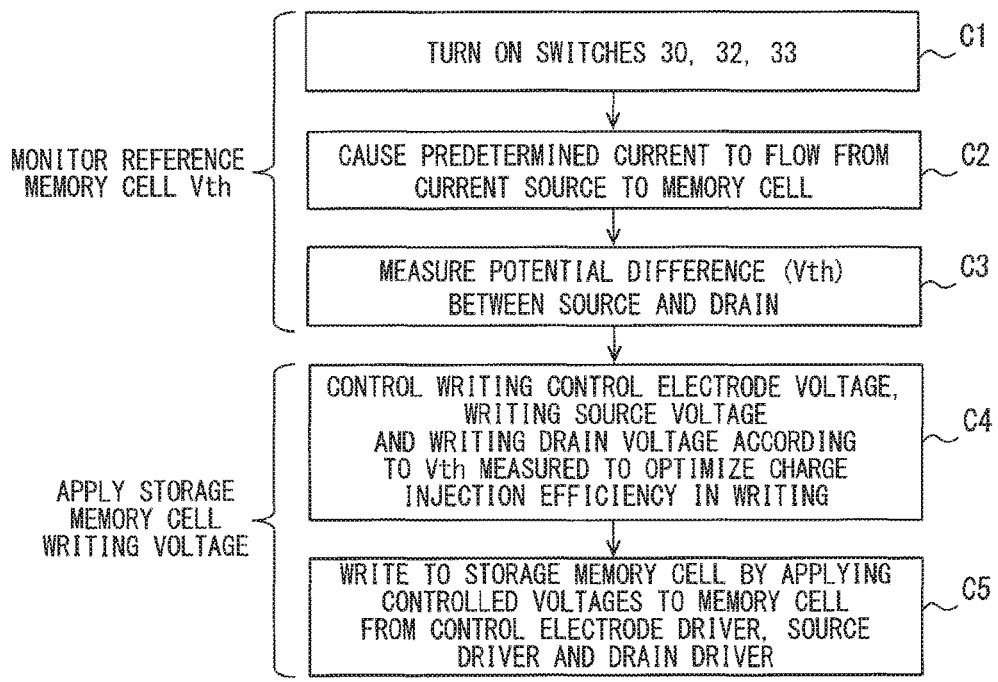
FIG. 6 is a flowchart illustrating an outline of a writing processing of the semiconductor storage device according to the third embodiment.

In a writing processing of the third embodiment, as shown in FIG. 6, firstly, the switches 30, 32 and 33 are turned on (C1). Next, a predetermined current is caused from the current source 20 to the reference memory cell 121a (C2). That is, a voltage is applied between the control electrode 122a connected to the drain 125a and the source 124a. Subsequently, a potential difference (i.e., voltage, potential difference) between the source 124a and the drain 125a is measured by the voltage measurement circuit 22 (C3). In this case, the value of the predetermined current is very small, and is for example, defined as 1 μA. Since the control electrode 122a and the drain 125a are in the connected state, the threshold voltage (Vth) of the reference memory cell 121a can be measured by measuring the potential difference (voltage) between the source 124a and the drain 125a.

Next, based on the potential difference described above, that is, based on the threshold voltage of the reference memory cell 121a, a writing control voltage to be applied to the control electrode 132 of the storage memory cell 131, a writing source voltage to be applied to the source 134, and a writing drain voltage to be applied to the drain 135 are controlled (C4). These voltages are controlled based on the threshold voltage (Vth) of the memory cell obtained by the step C3 so that the injection efficiency of electrons to a floating electrode 133 of the storage memory cell 131 at the threshold voltage is optimum.

Next, the voltages controlled are applied to the storage memory cell 131 respectively from the control electrode driver 182, the source driver 142 and the drain driver 162, to thereby execute the writing to the storage memory cell 131 until the threshold voltage reaches a target threshold voltage (C5).

According to the semiconductor storage device 10 and the method for writing of the semiconductor storage device 10 of the third embodiment, in addition to the advantageous effects similar to the first embodiment, the following effects can be achieved. That is, since the reference memory cell 121a and the storage memory cell 131 are separately provided, the writing to the storage memory cell 131 can be started at the same time as measuring the threshold voltage of the reference memory cell 121a. Therefore, the total writing time can be shortened.

Fourth Embodiment

Next, a fourth embodiment will be described. In the fourth embodiment, the reference number "121a" denotes a first reference memory cell (first reference flash memory) 121a.

Figure 7:
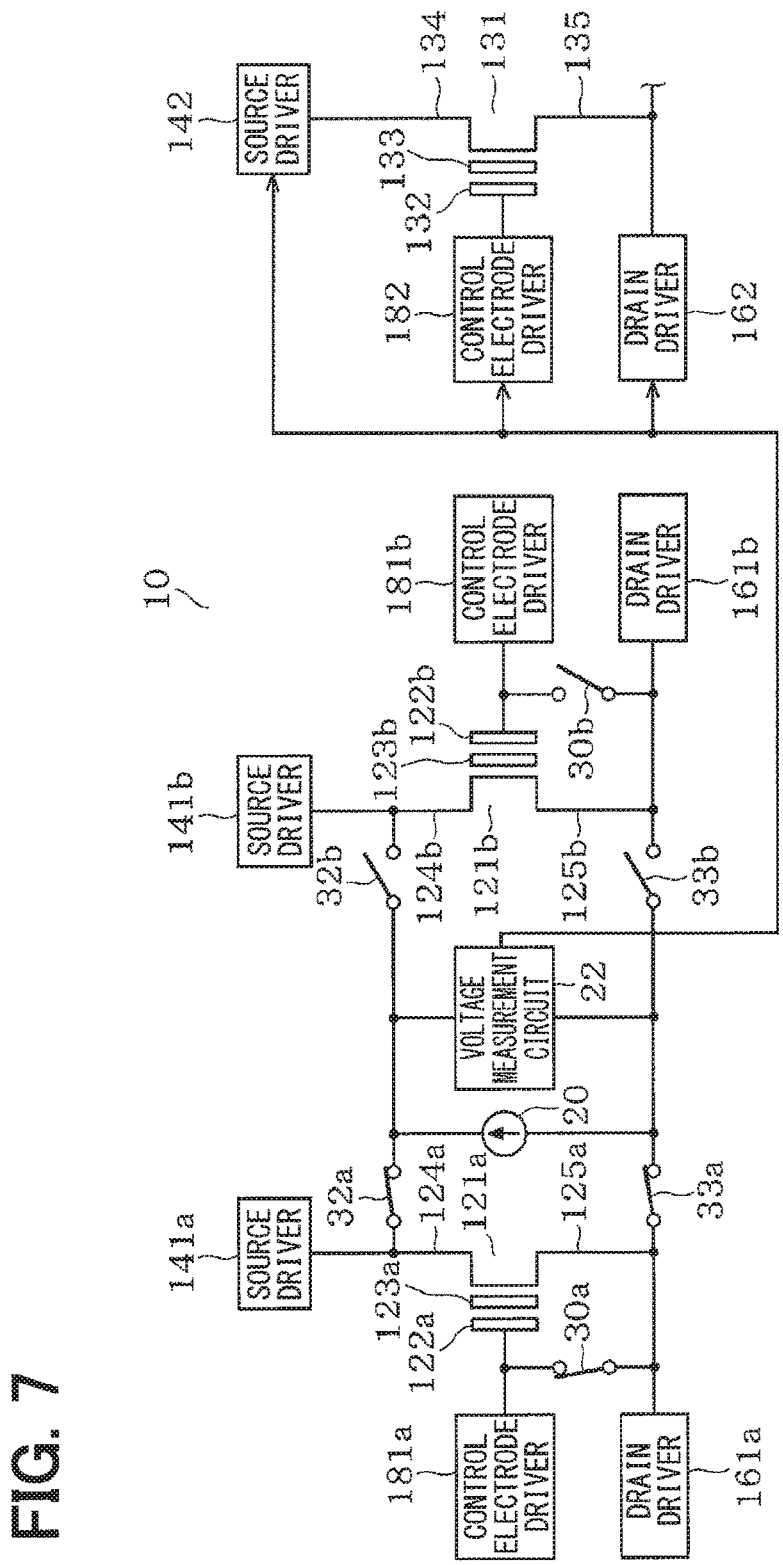
FIG. 7 is a block diagram illustrating an example of a structure of a semiconductor storage device according to a fourth embodiment.

The fourth embodiment is different from the third embodiment on a point that the first reference memory cell 121a and a second reference memory cell 121b are provided. As shown in FIG. 7, a semiconductor storage device 10 includes the first reference memory cell 121a and the second reference memory cell 121b. The first reference memory cell 121a includes a control electrode 122a, and a floating electrode 123a. The second memory cell 121b includes a control electrode 122b and a floating electrode 123b. The first reference memory cell 121a and the second reference memory cell 121b are connected symmetric with respect to a current source 20 and a switch 30.

A source 124a of the first reference memory cell 121a is connected to the current source 20 and one of terminals of the voltage measurement circuit 22 through a switch 32a. A drain 125a of the first reference memory cell 121a is connected to the current source 20 and the other one of the terminals of the voltage measurement circuit 22 through a switch 33a. Assumed that the first reference memory cell 121a is in a state of before the writing, and a threshold voltage of the first reference memory cell 121a is adjusted to be at a level of before the writing.

A source driver 141a is connected to the source 124a of the first reference memory cell 121a. A drain driver 161a is connected to the drain 125a. A control electrode driver 181a is connected to the control electrode 122a, A switch 30 is provided between the control electrode 122a and the drain 125a, and is configured to switch on and off the connection between the control electrode 122a and the drain 125a. The switch 32a and the switch 33a are respectively provided between the source 124a and the current source 20 and voltage measurement circuit 22, and between the drain 125a and the current source 20 and voltage measurement circuit 22, and are configured to switch on and off the connections therebetween.

The second reference memory cell 121b has similar structures to those of the first reference memory cell 121a. The second reference memory cell 121b and the first reference memory cell 121a are symmetrically connected with respect to the current source 20 and the voltage measurement circuit 22. The structures of the second reference memory cell (second reference flash memory) 121b and the structures around the second reference memory cell 121b can be understood by replacing the suffix "a" of the reference number of each structure in association with the first reference cell 121a with "b", and thus the description of the structures of the second reference memory cell 121b and the structures around the second reference memory cell 121b will be omitted. Assumed that the second reference memory cell 121b is in a state during the writing. For example, the second reference memory cell 121b is adjusted to have a threshold voltage of approximately 70% of the target threshold voltage.

The voltage measurement circuit 22 measures the threshold voltages of the first reference memory cell 121a and the second reference memory cell 121b, and outputs the measurement results to the source driver 142, the control driver 182 and the drain driver 162. The source driver 142, the control electrode driver 182 and the drain driver 162 control the writing to the storage memory cell 131 based on the threshold voltages received.

Figure 8:
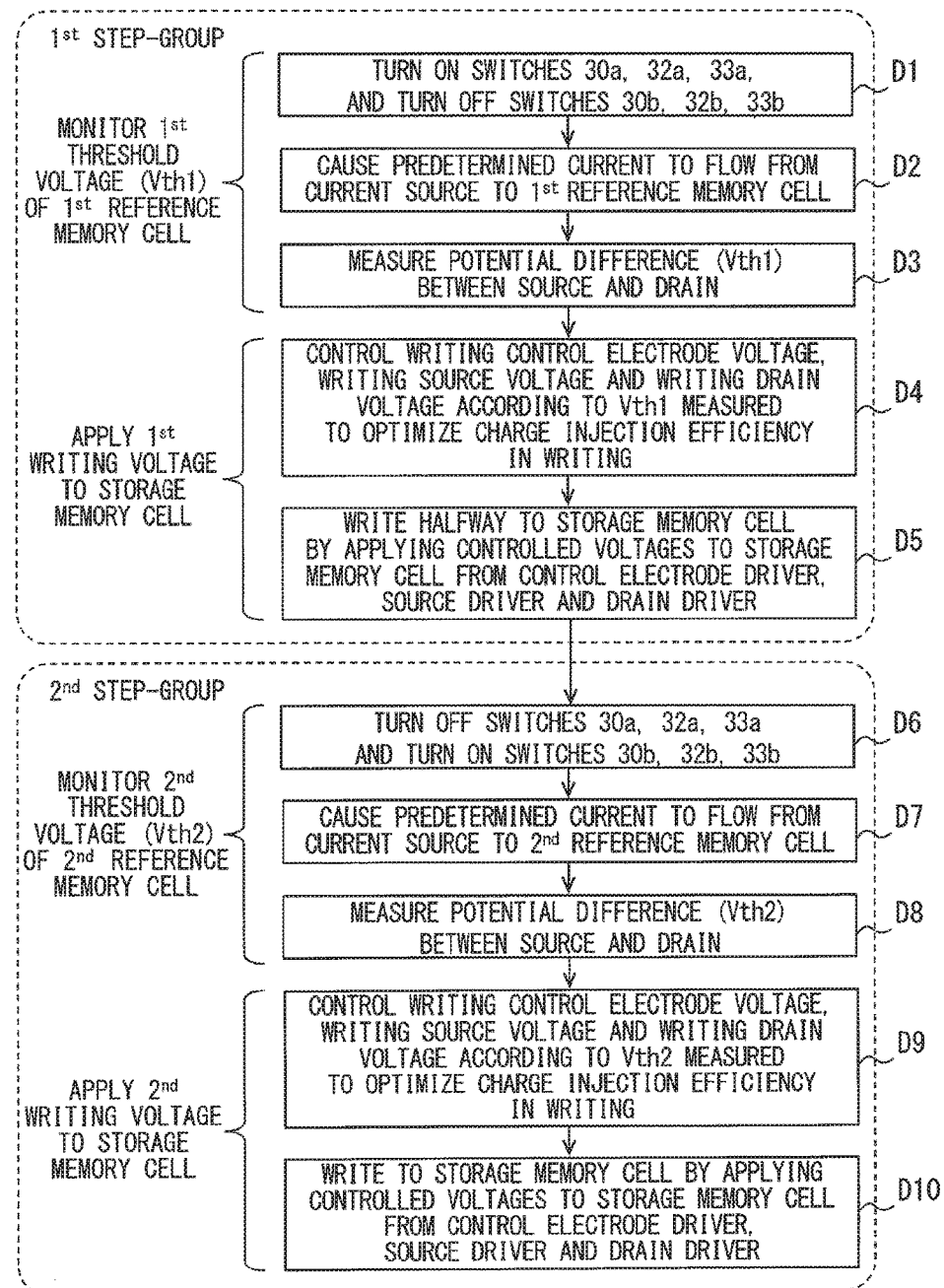
FIG. 8 is a flowchart illustrating an outline of a writing processing of the semiconductor storage device according to the fourth embodiment.

In a writing processing of the fourth embodiment, as shown in FIG. 8, firstly, the switch 30a, 32a, and 33a are turned on, and the switches 30b, 32b and 33b are turned off (D1). Next, a predetermined current is caused to flow to the first reference memory cell 121a from the current source 20 (D2). That is, a voltage is applied between the control electrode 122a connected to the drain 125a and the source 124a. Next, a first voltage between the source 124a and the drain 125a is measured by the voltage measurement circuit 22 (D3). In this case, the predetermined current has a very small current value, which is for example defined as 1 μA. Since the control electrode 122a and the drain 125a are in a connected state, the first voltage is the threshold voltage of the first reference memory cell 121a. Hereinafter, the first voltage will be referred to as a first threshold voltage (Vth1).

Next, based on the first voltage described hereinabove, that is, based on the first threshold voltage of the first reference memory cell 121a, a writing control electrode voltage to be applied to the control electrode 132 of the storage memory cell 131, a writing source voltage to be applied to the source 134, and a writing drain voltage to be applied to the drain 135 are controlled (D4). These voltages are controlled based on the first threshold voltage (Vth1) obtained by the step D3 so that the injection efficiency of electrons to the floating electrode 133 of the storage memory cell 131 at the first threshold voltage is optimum.

Next, the voltages controlled are applied to the storage memory cell 131 respectively from the control electrode driver 182, the source driver 142, and the drain driver 162, thereby to execute the writing to the storage memory cell 131. In this case, however, the writing is not completed, but is executed until the threshold voltage of the storage memory cell 131 reaches a second threshold voltage, which will be described hereinafter (D5). The second threshold voltage is, for example, defined as approximately 70% of the target threshold voltage.

The steps D1 to D5 described hereinabove are categorized into a first step group, and the writing executed by the first step group is referred to as the first writing.

Next, the switches 30a, 32a and 33a are turned off, and the switches 30b, 32b and 33b are turned on (D6). As such, the current source 20 and the voltage measurement circuit 22 are connected to the second reference memory cell 121b.

Next, a predetermined current is caused to flow to the second memory cell 121b from the current source 20 (D7). Subsequently, a second potential difference (i.e., voltage, potential difference) between the source 124b and the drain 125b is measured by the voltage measurement circuit 22 (D8). In this case, the predetermined current has a very small current value, which is, for example, defined as 1 μA. Since the control electrode 122b and the drain 125b are in the connected state, the second potential difference (voltage) is the threshold voltage of the second reference memory cell 121b. Hereinafter, the second potential difference will be referred to as a second threshold voltage (Vth2).

Next, based on the second potential difference, that is, based on the second threshold voltage of the second reference memory cell 121b, a writing control electrode voltage to be applied to the control electrode 132 of the storage memory cell 131, a writing source voltage to be applied to the source 134, and a writing drain voltage to be applied to the drain 135 are controlled (D9). These voltages are controlled based on the second threshold voltage (Vth2) obtained by the step D8 so that the injection efficiency of electrons to the floating electrode 133 of the storage memory cell 131 at the second threshold voltage is optimum.

Next, the voltages controlled are applied to the storage memory cell 131 respectively from the control electrode driver 182, the source driver 142, and the drain driver 162, thereby to execute the writing to the storage memory cell 131 (D10). In this case, the writing to the storage memory cell 131 is executed until the threshold voltage reaches a target threshold voltage.

The steps D6 to D10 described hereinabove are categorized into a second step group, and the writing executed by the second step group is referred to as the second writing.

According to the fourth embodiment, the similar advantageous effects to those of the first embodiment, the second embodiment and the third embodiment will be achieved. In the fourth embodiment, further, the first reference memory cell 121a and the second reference memory cell 121b are provided separately from the storage memory cell 131. The writing processing to the storage memory cell 131 is firstly controlled based on the first threshold voltage of the first reference memory cell 121a monitored, and is subsequently switched to control based on the second threshold voltage of the second reference memory cell 121b. In this way, the writing to the storage memory cell 131 is executed. Accordingly, the first threshold voltage and the second threshold voltage are further accurately monitored, and thus the writing can be efficiently executed. Also, the writing can be uniform.

Note that, in the fourth embodiment, the writing to the storage memory cell 131 is divided into the first writing executed by the first step group and the second writing executed by the second step group, as exemplarily described hereinabove. However, the writing to the storage memory cell 131 is not limited to the example. As another example, a plurality of reference memory cells may be provided to have a plurality of threshold voltages that are leveled from the threshold voltage before the writing to the threshold voltage of the timing of the completion of the writing. The writing to the storage memory cell 131 may be repeated until the threshold voltage of the storage memory cell 131 reaches the target threshold voltage while monitoring the threshold voltage of each of the plurality of memory cells and switching the writing voltages. That is, in addition to the first and second reference memory cells, a third reference memory cell and a fourth reference memory cell are provided, for example. The threshold voltages of these reference memory cells are adjusted so that the these reference memory cells have threshold voltages, which are different subsequently from the threshold voltage before the writing to the threshold voltage at the timing of the completion of the writing. Further, the writing to the storage memory cell 131 is repeated, as in a manner of a first writing, a second writing, a third writing and a fourth writing, until the threshold voltage of the storage memory cell 131 reaches a target threshold voltage while monitoring the threshold voltages of the reference memory cells and switching the writing voltages.

Fifth Embodiment

Next, a fifth embodiment will be described. In the fifth embodiment, a comparator 40 connected to a threshold reference memory cell 121c and voltage measurement circuits 22c and 22b is provided. The comparator 40 compares a threshold of a storage memory cell 131 after writing and a threshold of the threshold reference memory cell 121a, to thereby verify the threshold of the storage memory cell 131 after the writing.

Figure 9:
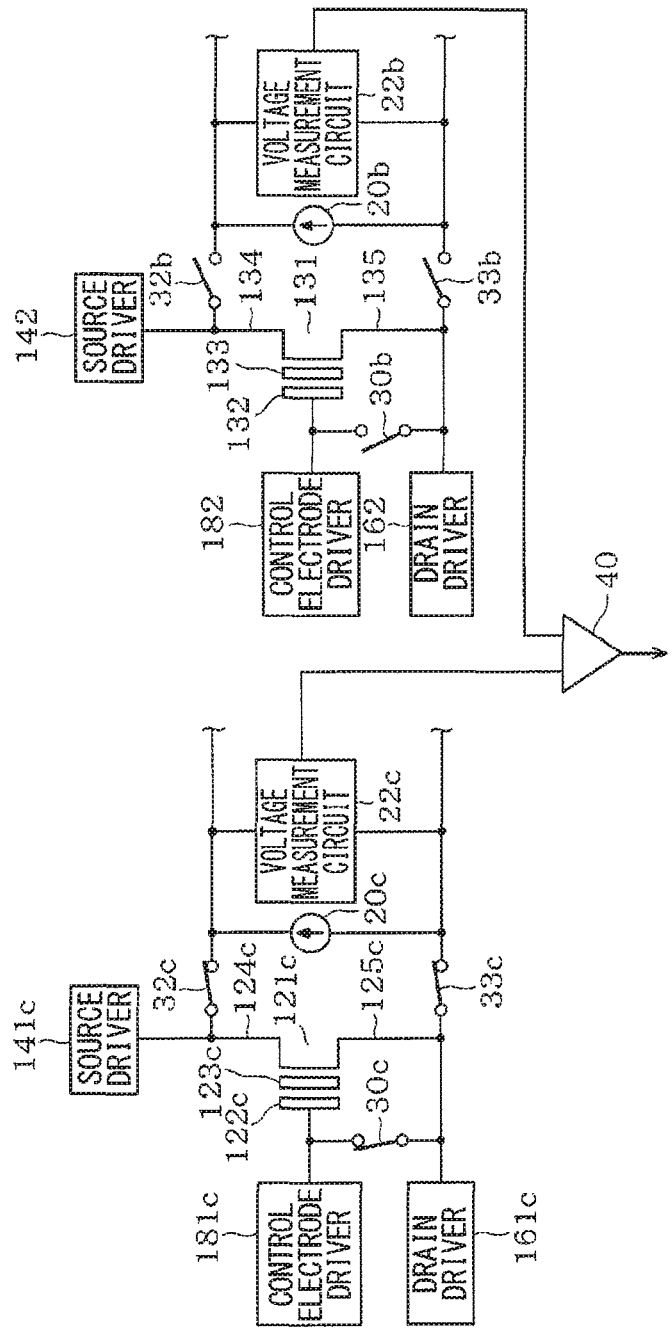
FIG. 9 is a block diagram illustrating an example of a structure of a semiconductor storage device according to a fifth embodiment.

As shown in FIG. 9, a semiconductor storage device 10 includes the threshold reference memory cell 121c, the storage memory cell 131, and the comparator 40. The structure of the threshold reference memory cell 121c and the structures around the threshold reference memory cell 121c are similar to those of the first reference memory cell 121a of the third embodiment shown in FIG. 5, and can be understood by replacing suffix of the reference number with "c". Thus, descriptions of portions that are substantially the same will be omitted.

The threshold reference memory cell 121c has the voltage measurement circuit 22c. The voltage measurement circuit 22c is connected to the comparator 40. The measurement result of the voltage measurement circuit 22c is provided to the comparator 40. The threshold reference memory cell 121c is written in advance, and has the threshold after the writing.

A source 134 of the storage memory cell 131 is connected to a current source 20b and one of the terminals of the voltage measurement circuit 22b through a switch 32b. A drain 135 of the storage memory cell 131 is connected to the current source 20 and the other one of the terminals of the voltage measurement circuit 22b through a switch 33b. The voltage measurement circuit 22b is connected to the comparator 40, and provides the measurement result to the comparator 40.

The comparator 40 compares the measurement value received from the voltage measurement circuit 22 and the measurement value received from the voltage measurement circuit 22b, that is, compares the threshold of the threshold reference memory cell 121c and the threshold of the storage memory cell 131.

FIG. 10 shows a writing processing of the fifth embodiment. The writing to the storage memory cell 131 may employ any of the writings of the first to fourth embodiments. For example, after the writing to the storage memory cell 131 is executed by the method of the third embodiment including the steps C1 to C5, the switches 30c, 32c and 33c of the threshold reference memory cell 121c are turned on (E1). Next, a predetermined current is caused to flow to the threshold reference memory cell 121c from the current source 20c (E2). Subsequently, a voltage generated between the source 124c and the drain 125c is measured by the voltage measurement circuit 22c (E3). Since the control electrode 122c and the drain 125c are in the connected state, the voltage between the source 124c and the drain 125c is the threshold voltage (Vth) of the threshold reference memory cell 121c.

Next, the switches 30b, 32b and 33b of the storage memory cell 131 are turned on (E4). Next, the control electrode driver 182 applies a voltage to the control electrode 132 until a predetermined current flows from the current source 20b to the storage memory cell 131 (E5). That is, the voltage is applied between the control electrode 132 and the source 134. Subsequently, a potential difference (i.e., voltage, potential difference) between the source 134 and the drain 135 is measured by the voltage measurement circuit 22b (E6). Since the control electrode 132 and the drain 135 are in the connected state, the potential difference is the threshold voltage (Vth) of the storage memory cell 131. Note that the steps of E1 to E3 and the steps of E4 to E6 may be conducted in reversed order.

Next, the comparator 40 compares the threshold of the threshold reference memory cell 121c and the threshold of the storage memory cell 131 (E7), and the threshold written in the storage memory cell 131 is verified (E8).

As a result of the verification, if the threshold of the storage memory cell 131 has not reached a target threshold, it is determined that additional writing is necessary (E9: Yes), and the additional writing is executed (E10). The additional writing is repeated until the threshold of the storage memory cell 131 reaches the target value. The additional writing can be executed by any writing method of the first to fourth embodiments. As a result of the verification, if the threshold of the storage memory cell 131 has reached the target threshold (E9: No), the writing processing is ended (E11).

According to the fifth embodiment, the state of writing to the storage memory cell 131 can be known by the verification. Therefore, the additional writing can be executed, as required. As such, the writing can be further accurately executed, contributing to evenness of the writing.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

For example, the writing to the storage memory cell 131 may be executed by writing methods of the first to fourth embodiments in any combination.

DESCRIPTION OF REFERENCE NUMBERS

10: Semiconductor storage device,
121: Memory cell
121a: First reference memory cell (Reference memory cell)
121b: Second reference memory cell (Reference memory cell)
121c: Threshold reference memory cell
122: Control electrode
122a: Control electrode (First control electrode)
122c: Control electrode (Third control electrode)
123: Floating electrode
123a: Floating electrode (First floating electrode)
123c: Third floating electrode
124: Source
124a: Source (First source)
124c: Source (Third source)
125: Drain
125a: Drain (First drain)
125c: Drain (Third drain)
131: Storage memory cell
132: Control electrode (Second control electrode)
133: Floating electrode (Second floating electrode)
134: Source (Second source)
135: Drain (Second drain)
14: Source driver
141: Source driver (First source driver)
142: Source driver (Second source driver)
16: Drain driver
161: Drain driver (First drain driver)
162: Drain driver (Second drain driver)
18: Control electrode driver
181: Control electrode driver (First control electrode driver)
182: Control electrode driver (Second control electrode driver)
20: Current source
22: Voltage measurement circuit
22b: Voltage measurement circuit (Second voltage measurement circuit)
22c: Voltage measurement circuit (Third voltage measurement circuit)
30: Switch
30b: Switch (Second switch)
30c: Switch (Third switch)
40: Comparator

The invention claimed is:

1. A semiconductor storage device comprising:
   a memory cell that includes a control electrode, a floating electrode, a source and a drain;
   a switch that is configured to connect the control electrode and the drain;
   a source driver that is connected to the source and is configured to apply a predetermined voltage to the source;
   a current source that is configured to be connected to the source and to supply a predetermined current to the source;
   a drain driver that is connected to the drain and is configured to apply a predetermined voltage to the drain;
   a voltage measurement circuit that is configured to measure a voltage generated between the control electrode and the source; and
   a control electrode driver that is configured to apply a predetermined voltage to the control electrode, wherein
   in a writing to the memory cell, the voltage measurement circuit measures a voltage generated between the control electrode and the source when the switch is in an on state and a predetermined current flows from the current source to the memory cell, and
   the control electrode driver applies to the control electrode a voltage that is controlled based on the voltage measured by the voltage measurement circuit.

2. A method for writing of a semiconductor storage device, the semiconductor storage device including:
   a memory cell that has a control electrode, a floating electrode, a source and a drain;
   a switch that connects between the control electrode and the drain;
   a source driver that is connected to the source and applies a predetermined voltage to the source;
   a current source that is configured to be connected to the source and to supply a predetermined current to the source;
   a drain driver that is connected to the drain and applies a predetermined voltage to the drain;
   a voltage measurement circuit that measures a voltage generated between the control electrode and the source; and
   a control electrode driver that applies a predetermined voltage to the control electrode,
   the method for writing of the semiconductor storage device, comprising, in a writing to the memory cell:
   turning on the switch and causing the predetermined current to flow from the current source to the memory cell;
   measuring a voltage generated between the control electrode and the source by the voltage measurement circuit when the predetermined current flows between the source and the drain; and
   applying a voltage that is controlled based on the voltage measured to the control electrode from the control electrode driver.

3. A method for writing of a semiconductor storage device, the semiconductor storage device including:
   a memory cell that has a control electrode, a floating electrode, a source and a drain;
   a switch that connects the control electrode and the drain;
   a source driver that is connected to the source and applies a predetermined voltage to the source;

a current source that is configured to be connected to the source and to supply a predetermined current to the source;
a drain driver that is connected to the drain and applies a predetermined voltage to the drain;
a voltage measurement circuit that measures a voltage generated between the control electrode and the source; and
a control electrode driver that applies a predetermined voltage to the control electrode,
the method for writing of the semiconductor storage device, comprising, in a writing to the memory cell:
turning on the switch and causing the predetermined current to flow from the current source to the memory cell;
measuring a first voltage generated between the control electrode and the source by the voltage measurement circuit when the predetermined current flows between the source and the drain;
executing a first writing by applying a voltage that is controlled based on the first voltage to the control electrode from the control electrode driver;
turning on the switch and causing the predetermined current to flow from the current source to the memory cell;
measuring a second voltage generated between the control electrode and the source by the voltage measurement circuit when the predetermined current flows between the source and the drain; and
executing a second writing by applying a voltage that is controlled based on the second voltage to the control electrode from the control electrode driver.

4. A method for writing of a semiconductor storage device, the semiconductor storage device including:
a memory cell that has a control electrode, a floating electrode, a source and a drain;
a switch that connects the control electrode and the drain;
a source driver that is connected to the source and applies a predetermined voltage to the source;
a current source that is configured to be connected to the source and to supply a predetermined current to the source;
a drain driver that is connected to the drain and applies a predetermined voltage to the drain;
a voltage measurement circuit that measures a voltage generated between the control electrode and the source; and
a control electrode driver that applies a predetermined voltage to the control electrode,
the method for writing of the semiconductor storage device, comprising, in a writing to the memory cell:
turning on the switch and causing the predetermined current to flow from the current source to the memory cell;
measuring a voltage generated between the control electrode and the source by the voltage measurement circuit when the predetermined current flows between the source and the drain; and
executing a writing by applying a voltage that is controlled based on the voltage measured to the control electrode from the control electrode driver, wherein
the turning on the switch, the causing the predetermined current to flow, the measuring the voltage, and the executing the writing are repeated until the voltage reaches a predetermined value.

5. A semiconductor storage device comprising:
a reference memory cell that at least includes a first control electrode, a first floating electrode, a first source and a first drain;
a storage memory cell that at least includes a second control electrode, a second floating electrode, a second source, and a second drain;
a first source driver that is connected to the first source and is configured to apply a predetermined voltage to the first source;
a current source that is configured to be connected to the first source and the second source and to supply a predetermined current to the first source or the second source;
a first drain driver that is connected to the first drain and is configured to apply a predetermined voltage to the first drain;
a switch that is configured to connect the first control electrode and the first drain;
a voltage measurement circuit that is configured to measure a voltage generated between the first control electrode and the first source;
a first control electrode driver that is configured to apply a predetermined voltage to the first control electrode;
a second source driver that is connected to the second source and is configured to apply a predetermined voltage to the second source;
a second drain driver that is connected to the second drain and is configured to apply a predetermined voltage to the second drain; and
a second control electrode driver that is configured to apply a predetermined voltage to the second control electrode, wherein
the voltage measurement circuit measures a voltage generated between the first control electrode and the first source when the switch is in an on state and the predetermined current flows from the current source to the memory cell, and
the second source driver, the second drain driver, the second control electrode driver generate voltages that are controlled based on the voltage that is generated between the first control electrode and the first source electrode and is measured by the voltage measurement circuit.

6. The semiconductor storage device according to claim 5, wherein
the reference memory cell is one of a plurality of the reference memory cells having different thresholds,
the plurality of memory cells are written to have the different thresholds from a threshold before writing to the storage memory cell to a threshold after completion of the writing to the storage memory cell,
in the writing to the storage memory cell, the voltage applied from the second control electrode is switched by sequentially measuring the voltages between the first control electrode and the first source of the reference memory cells from one having the threshold before the writing.

7. The semiconductor storage device according to claim 5, wherein
the storage memory cell includes a second switch that is configured to connect the second control electrode and the second drain, and a second voltage measurement circuit that is configured to measure a voltage generated between the second control electrode and the second source,
the semiconductor storage device further comprising:
a threshold reference memory cell that includes a third control electrode, a third floating electrode, a third source, a third drain, a third switch configured to connect the third control electrode and the third drain, and a third voltage measurement circuit configured to measure a voltage generated between the third control electrode and the third source;
a comparator that is connected to the second voltage measurement circuit and the third voltage measurement circuit, wherein
the second voltage measurement circuit measures a first voltage generated between the second control electrode and the second source when the second switch is in an on state and the predetermined current flows between the second control electrode and the second source,
the third voltage measurement circuit measures a second voltage generated between the third control electrode and the third source when the third switch is in an on state and the predetermined current flows between the third control electrode and the third source, and
the comparator compares the first voltage and the second voltage, thereby to verify that a predetermined writing to the storage memory cell has been executed.

8. A method for writing of a semiconductor storage device, the semiconductor storage device including:
a reference memory cell that at least includes a first control electrode, a first floating electrode, a first source and a first drain;
a storage memory cell that at least includes a second control electrode, a second floating electrode, a second source, and a second drain;
a first source driver that is connected to the first source and applies a predetermined voltage to the first source;
a current source that is connected to the first source and supplies a predetermined current to the first source;
a first drain driver that is connected to the first drain and applies a predetermined voltage to the first drain;
a switch that is configured to connect the first control electrode and the first drain;
a voltage measurement circuit that measures a voltage generated between the first control electrode and the first source;
a first control electrode driver that applies a predetermined voltage to the first control electrode;
a second source driver that is connected to the second source and applies a predetermined voltage to the second source;
a second drain driver that is connected to the second drain and applies a predetermined voltage to the second drain; and
a second control electrode driver that applies a predetermined voltage to the second control electrode,
the method for writing of the semiconductor storage device, comprising:
measuring a voltage generated between the first control electrode and the first source when the switch is in an on state and the predetermined current flow from the current source to the reference memory cell; and
controlling voltages to be generated from the second source driver, the second drain driver and the second control electrode driver based on the voltage that is generated between the first control electrode and the first source and is measured by the voltage measurement circuit.

9. The method for writing of the semiconductor storage device, according to claim 8, wherein
the reference memory cell is one of a plurality of reference memory cells having different thresholds, and the plurality of reference memory cells are written to have the different thresholds from a threshold before writing to the storage memory cell to a threshold after completion of the writing to the storage memory cell, and
in the writing to the storage memory cell, the second control electrode is applied with a voltage that is sequentially switched based on the voltages generated between the first control electrode and the first source of the reference memory cells from one having the threshold before the writing.

10. The method for writing of the semiconductor storage device, according to claim 8, wherein
the storage memory cell includes a second switch that connects the second control electrode and the second drain, and a second voltage measurement circuit that measures a voltage generated between the second control electrode and the second source, and
the semiconductor storage device further includes:
a threshold reference memory cell that includes a third control electrode, a third floating electrode, a third source, a third drain, a third switch connecting the third control electrode and the third drain, and a third voltage measurement circuit measuring a voltage generated between the third control electrode and the third source; and
a comparator that is connected to the third voltage measurement circuit and the second voltage measurement circuit,
the method for writing of the semiconductor storage device, further comprising:
measuring a first voltage generated between the second control electrode and the second source by the second voltage measurement circuit when the second switch is in an on state and the predetermined current flows between the second control electrode and the second source;
measuring a second voltage generated between the third control electrode and the third source by the third voltage measurement circuit when the third switch is in an on state and the predetermined current flows between the third control electrode and the third source; and
executing a threshold verification to confirm that the writing of the storage memory cell has been executed by comparing the first voltage and the second voltage by the comparator.

* * * * *